United States Patent
Akkermans et al.

(10) Patent No.: US 10,372,045 B2
(45) Date of Patent: Aug. 6, 2019

(54) METHOD OF CALIBRATING A RELUCTANCE ACTUATOR ASSEMBLY, RELUCTANCE ACTUATOR AND LITHOGRAPHIC APPARATUS COMPRISING SUCH RELUCTANCE ACTUATOR

(71) Applicant: ASML Netherlands B.V., Veldhoven (NL)

(72) Inventors: Johannes Antonius Gerardus Akkermans, Eindhoven (NL); Bas Pieter Lemmen, Venlo (NL); Sjoerd Martijn Huiberts, Best (NL); Joeri Lof, Eindhoven (NL); Petrus Theodorus Rutgers, Hengelo (NL); Sven Antoin Johan Hol, Eindhoven (NL); Harmeet Singh, Fremont, CA (US); Peter Michel Silvester Maria Heijmans, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 77 days.

(21) Appl. No.: 14/428,287

(22) PCT Filed: Aug. 26, 2013

(86) PCT No.: PCT/EP2013/067623
§ 371 (c)(1),
(2) Date: Mar. 13, 2015

(87) PCT Pub. No.: WO2014/044496
PCT Pub. Date: Mar. 27, 2014

(65) Prior Publication Data
US 2015/0234297 A1 Aug. 20, 2015

Related U.S. Application Data

(60) Provisional application No. 61/702,949, filed on Sep. 19, 2012.

(51) Int. Cl.
*G03F 7/20* (2006.01)
*H01F 7/08* (2006.01)
(Continued)

(52) U.S. Cl.
CPC ............ *G03F 7/70725* (2013.01); *G03F 7/22* (2013.01); *G03F 7/70758* (2013.01);
(Continued)

(58) Field of Classification Search
CPC .... G03F 7/70725; G03F 7/22; G03F 7/70758; H02P 25/06; H02P 25/034; H02P 25/08;
(Continued)

(56) References Cited

U.S. PATENT DOCUMENTS 5,126,641 A * 6/1992 Putman ................... F16F 15/03
318/127
5,468,055 A * 11/1995 Simon ..................... B60B 9/005
188/267

(Continued)

FOREIGN PATENT DOCUMENTS

EP    1 622 246 A2    2/2006
EP    1 970 941 A2    9/2008
(Continued)

OTHER PUBLICATIONS

English-Language Abstract for Japanese Patent Publication No. 2004-229345 A, published Aug. 12, 2004; 1 page.
(Continued)

*Primary Examiner* — Deoram Persaud
(74) *Attorney, Agent, or Firm* — Sterne, Kessler, Goldstein & Fox, P.L.L.C.

(57) ABSTRACT

A reluctance actuator assembly comprising a reluctance actuator, a flux sensor to measure a magnetic flux in a gap of the reluctance actuator, and a flux amplifier to drive an actuator coil of the reluctance actuator based on a flux set
(Continued)

point and the flux measured by the flux sensor. A method comprising providing to the flux amplifier a flux setpoint, the flux setpoint comprising a time constant component and a sinusoidally varying component at an excitation frequency, measuring a force generated by the reluctance actuator in response to the flux setpoint, and calibrating the reluctance actuator assembly from the measured force.

13 Claims, 8 Drawing Sheets

(51) Int. Cl.
| | |
|---|---|
| *H01F 7/16* | (2006.01) |
| *H02P 25/08* | (2016.01) |
| *H02P 6/16* | (2016.01) |
| *H02P 25/06* | (2016.01) |
| *H02K 41/025* | (2006.01) |
| *H02P 25/034* | (2016.01) |
| *G03F 7/22* | (2006.01) |
| *H02K 11/00* | (2016.01) |
| *H02K 41/03* | (2006.01) |

(52) U.S. Cl.
CPC .......... *H01F 7/081* (2013.01); *H01F 7/1646* (2013.01); *H02K 11/001* (2013.01); *H02K 41/025* (2013.01); *H02K 41/03* (2013.01); *H02K 41/033* (2013.01); *H02P 6/16* (2013.01); *H02P 25/034* (2016.02); *H02P 25/06* (2013.01); *H02P 25/08* (2013.01); *H02P 25/085* (2013.01)

(58) Field of Classification Search
CPC .......... H02P 25/085; H02P 6/16; H01F 7/081; H01F 7/1646; H02K 11/001; H02K 41/025; H02K 41/03; H02K 41/033
See application file for complete search history.

(56) References Cited

U.S. PATENT DOCUMENTS

| | | | | |
|---|---|---|---|---|
| 5,548,173 | A * | 8/1996 | Stephenson | H02K 1/246 310/168 |
| 5,672,925 | A * | 9/1997 | Lipo | H02K 19/103 310/154.11 |
| 6,771,310 | B1 * | 8/2004 | Torita | G02B 26/0875 348/219.1 |
| 7,375,479 | B2 | 5/2008 | Van Eijk et al. | |
| 7,408,276 | B2 | 8/2008 | Sato et al. | |
| 8,044,541 | B2 | 10/2011 | Toyota et al. | |
| 8,373,848 | B2 * | 2/2013 | Boon | G03F 7/70758 355/72 |
| 8,553,205 | B2 | 10/2013 | Roux et al. | |
| 2003/0052548 | A1 * | 3/2003 | Hol | G03F 7/70758 310/12.07 |
| 2003/0098962 | A1 * | 5/2003 | Kubo | G03F 7/70716 355/72 |
| 2004/0227707 | A1 | 11/2004 | Sato et al. | |
| 2005/0002008 | A1 * | 1/2005 | De Weerdt | F16C 39/063 355/72 |
| 2005/0017831 | A1 * | 1/2005 | Ito | G03F 7/70716 335/75 |
| 2005/0057101 | A1 * | 3/2005 | Nakagawa | H01F 7/1615 310/12.24 |
| 2007/0013895 | A1 * | 1/2007 | Okada | G03F 7/70725 355/72 |
| 2007/0069666 | A1 | 3/2007 | Van Eijk et al. | |
| 2008/0024749 | A1 | 1/2008 | Williams | |
| 2008/0265704 | A1 * | 10/2008 | Buhler | F16C 32/0457 310/90.5 |
| 2009/0002659 | A1 * | 1/2009 | Hiyama | G03B 27/42 355/53 |
| 2010/0085551 | A1 * | 4/2010 | Vermeulen | G03F 7/70716 355/71 |
| 2011/0069293 | A1 | 3/2011 | Hol et al. | |
| 2012/0019794 | A1 | 1/2012 | Hol et al. | |
| 2012/0206001 | A1 * | 8/2012 | Lee | H02K 1/146 310/112 |
| 2012/0212723 | A1 * | 8/2012 | Hol | H01F 7/081 355/67 |
| 2015/0212435 | A1 * | 7/2015 | Cox | H02K 41/0356 355/72 |
| 2016/0142634 | A1 * | 5/2016 | You | G03B 29/00 348/208.2 |
| 2016/0306183 | A1 * | 10/2016 | Niederer | G02B 27/48 |

FOREIGN PATENT DOCUMENTS

| | | |
|---|---|---|
| JP | 2000-217327 A | 8/2000 |
| JP | 2003-079122 A | 3/2003 |
| JP | 2004-229345 A | 8/2004 |
| JP | 2010-262969 A | 11/2010 |
| JP | 2011-035381 A | 2/2011 |
| WO | WO 92/12567 A1 | 7/1992 |
| WO | WO 9745944 A1 | 12/1997 |

OTHER PUBLICATIONS

Jung, J.S., et al., "Precision stage using a non-contact planar actuator based on magnetic suspension technology," Mechatronics, vol. 13, 2003; pp. 981-999.

International Search Report directed to related International Patent Application No. PCT/EP2013/067623, dated Jun. 13, 2014; 6 pages.

International Preliminary Report on Patentability and Written Opinion of the International Searching Authority directed to related International Patent Application No. PCT/EP2013/067623, dated Mar. 24, 2015; 11 pages.

Notification of Reasons for Refusal for related Japanese patent application No. 2017-001052, dated Jan. 9, 2018; 12 pages.

\* cited by examiner

Fig. 2
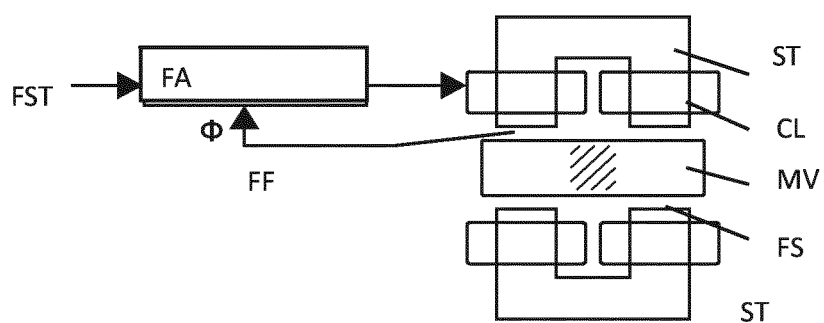
Fig. 3A
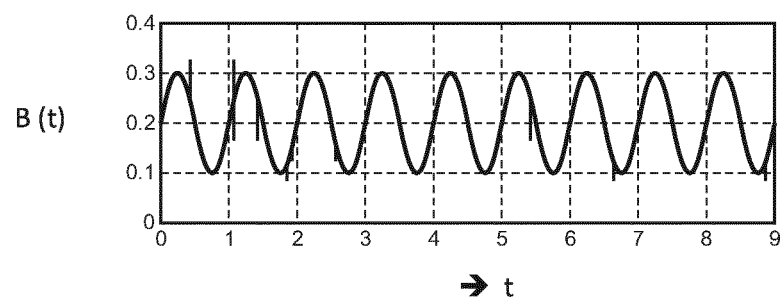
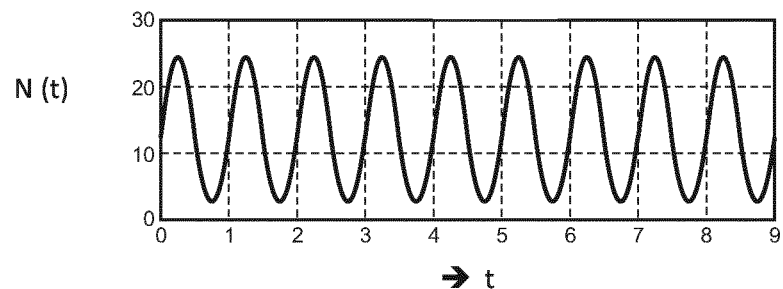
Fig. 3B

Fig. 6A
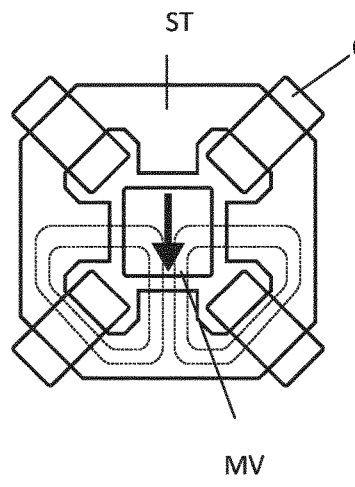
Fig. 6B
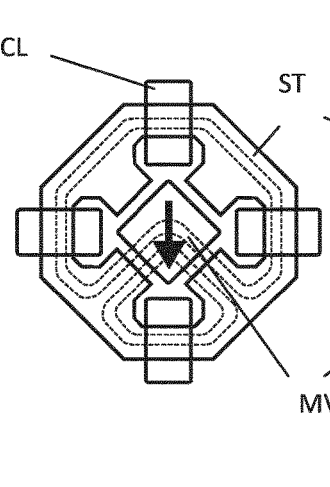
Fig. 6C
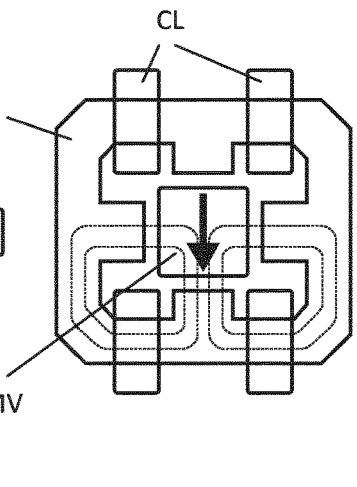
Fig. 7A
Fig. 7B
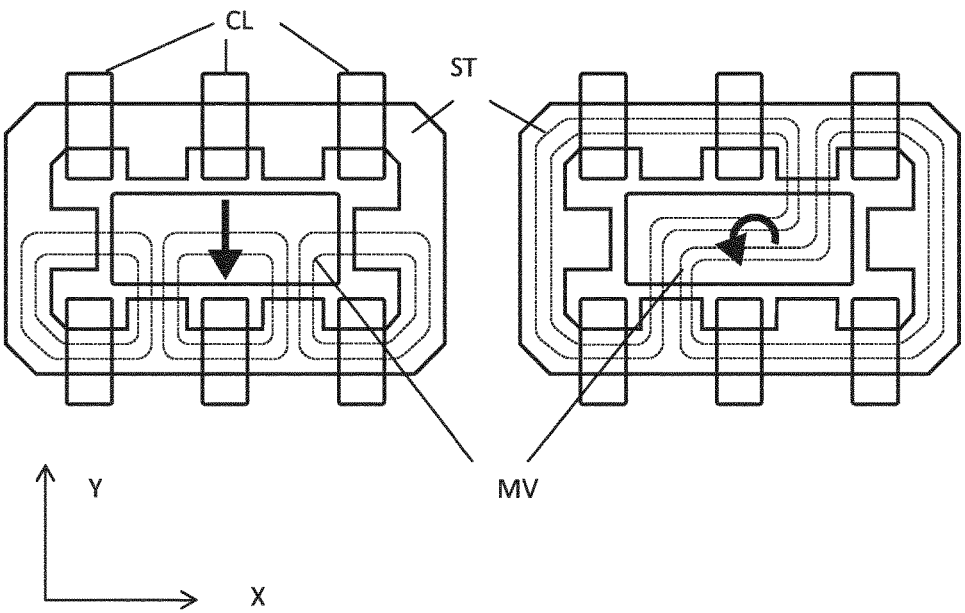

Fig. 12A
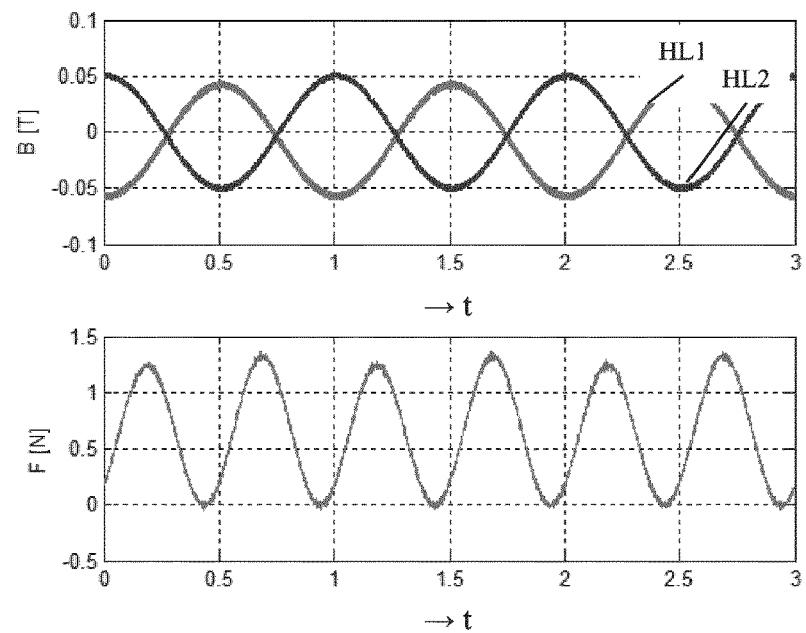
Fig. 12B
Fig. 13
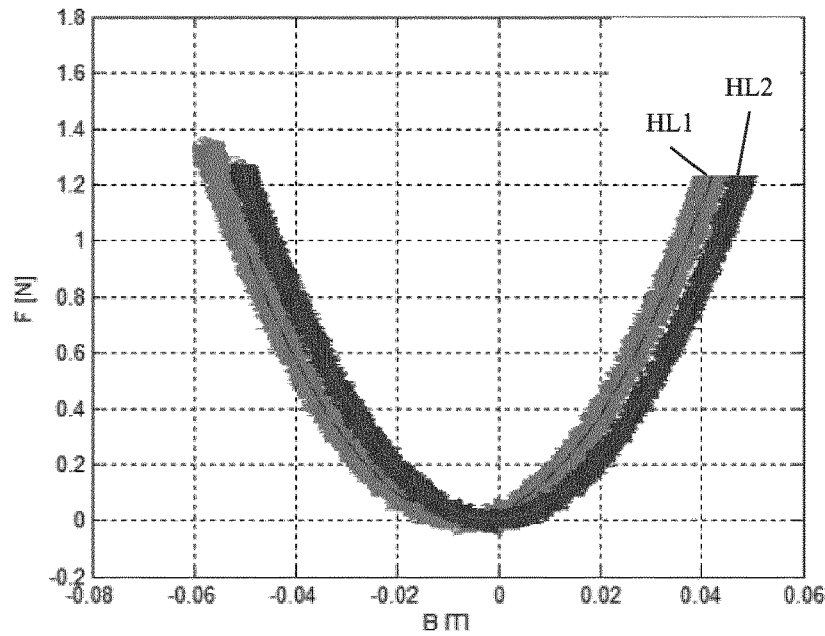

METHOD OF CALIBRATING A RELUCTANCE ACTUATOR ASSEMBLY, RELUCTANCE ACTUATOR AND LITHOGRAPHIC APPARATUS COMPRISING SUCH RELUCTANCE ACTUATOR

CROSS-REFERENCE TO RELATED APPLICATIONS

This application claims the benefit of U.S. provisional application 61/702,949, which was filed on Sep. 19, 2012, and which is incorporated herein in its entirety by reference.

BACKGROUND

Field of the Invention

The present invention relates to methods of calibrating a reluctance actuator assembly, to reluctance actuators and lithographic apparatuses comprising such reluctance actuators.

Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to achieve higher throughputs of the lithographic apparatus, and to be able to handle larger substrates, motors that allow to exert high forces onto for example the substrate table, may be required, while at the same time requiring a mass of such motors to be low.

BRIEF SUMMARY

It is desirable to provide some improvements in reluctance actuators and a calibration thereof.

According to an embodiment of the invention, there is provided a method of calibrating a reluctance actuator assembly, the reluctance actuator assembly comprising a reluctance actuator; a flux sensor to measure a magnetic flux in a gap of the reluctance actuator, a flux amplifier to drive an actuator coil of the reluctance actuator based on a flux set point and the flux measured by the flux sensor. The method comprises providing to the flux amplifier a flux setpoint comprising a time constant component and a sinusoidally varying component at an excitation frequency; measuring a force generated by the reluctance actuator in response to the flux setpoint, versus time; and calibrating the reluctance actuator assembly using the measured force.

In another embodiment of the invention, there is provided a method of calibrating a reluctance actuator assembly, the reluctance actuator assembly comprising a reluctance actuator, a flux sensor to measure a magnetic flux in a gap of the reluctance actuator, a flux amplifier to drive an actuator coil of the reluctance actuator based on a flux set point and the flux measured by the flux sensor. The method comprises moving by an external force a movable part of the reluctance actuator in respect of a stationary part thereof measuring by the flux sensor a flux during the moving; and determining a flux sensor offset using the measured flux sensor flux.

According to a further embodiment of the invention, there is provided a reluctance actuator, the reluctance actuator comprising a stator comprising a stator yoke forming a closed magnetic path around a center space, a plurality of teeth each projecting from the stator yoke into the center space, and a plurality of coils each being arranged for generating a magnetic flux in respective ones of the teeth; and a mover arranged in the center space, the mover comprising a plurality of faces, each of the faces facing a respective one of the teeth to form a gap between the mover and the respective one of the teeth.

According to a still further embodiment of the invention, there is provided a reluctance actuator, the reluctance actuator comprising a stator comprising a stator yoke, a plurality of teeth each projecting from the stator yoke, and a plurality of coils each being arranged for generating a magnetic flux in respective ones of the teeth. The pairs of permanent magnets are provided to generate a magnetic bias flux having a direction opposite to a flux generated in operation by the respective coil.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 2 depicts a highly schematic view of a reluctance actuator based on which a calibration method according to an aspect of the invention will be explained.

FIGS. 3A and 3B respectively depict magnetic flux and force versus time to illustrate the calibration method according to an aspect of the invention.

Figure 4:
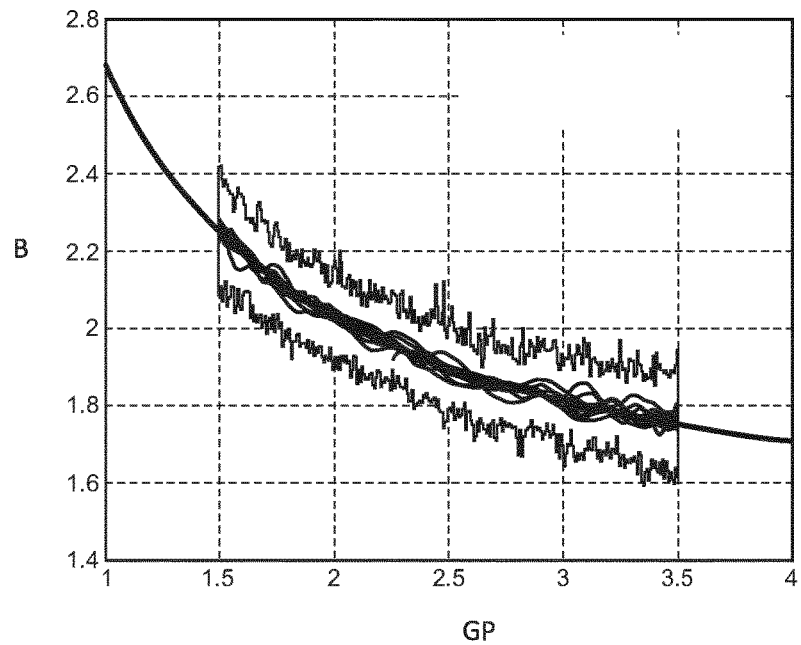

FIG. 4 depicts flux density versus gap size to illustrate a calibration method according to an aspect of the invention.

Figures 5A, 5B, 5C:
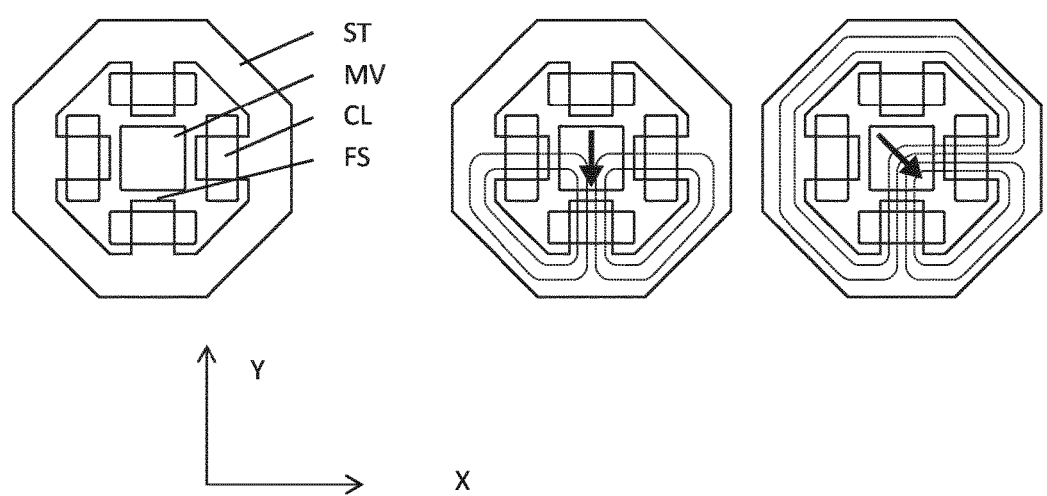

FIG. 5A-5C depict a schematic view of a reluctance actuator according to an embodiment of the invention.

FIG. 6A-6C depict a schematic view of a reluctance actuator according to an embodiment of the invention.

FIG. 7A-7B depict a schematic view of a reluctance actuator according to an embodiment of the invention.

Figure 8:
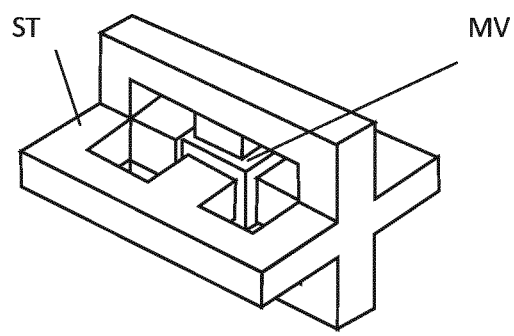

FIG. 8 depicts a schematic view of a reluctance actuator according to an embodiment of the invention.

Figures 9A, 9B:
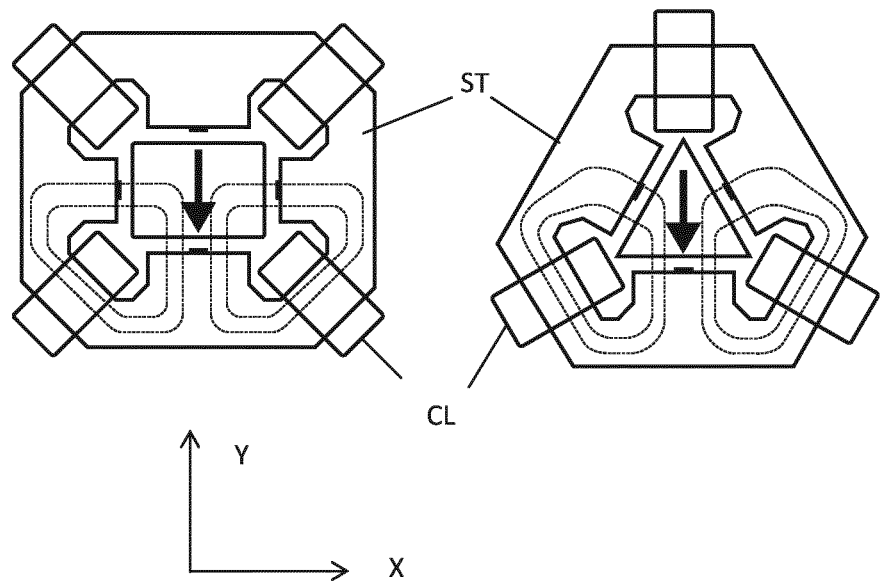

FIG. 9A-9B depict a schematic view of a reluctance actuator according to an embodiment of the invention.

Figures 10A, 10B:
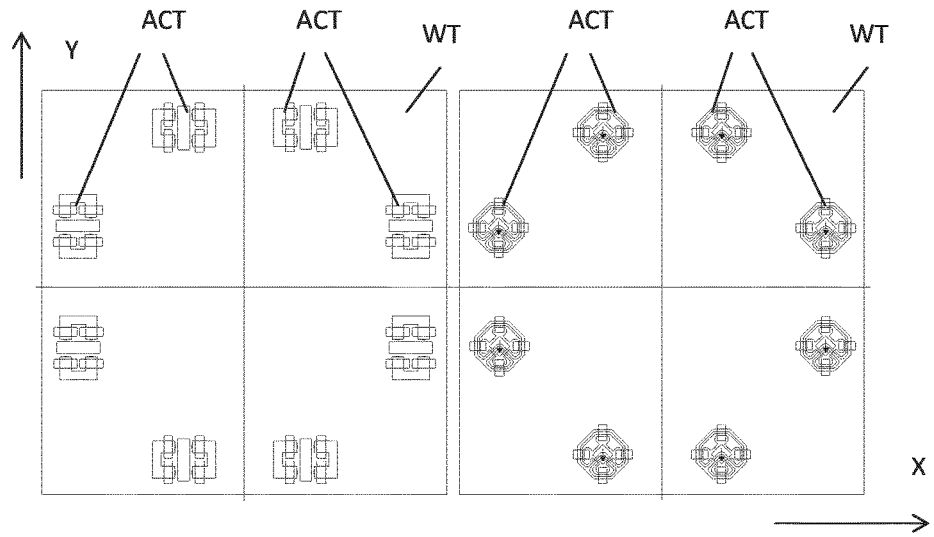

FIGS. 10A and 10B depict a schematic view of a stage comprising a reluctance actuators according embodiment of the invention.

Figure 11:
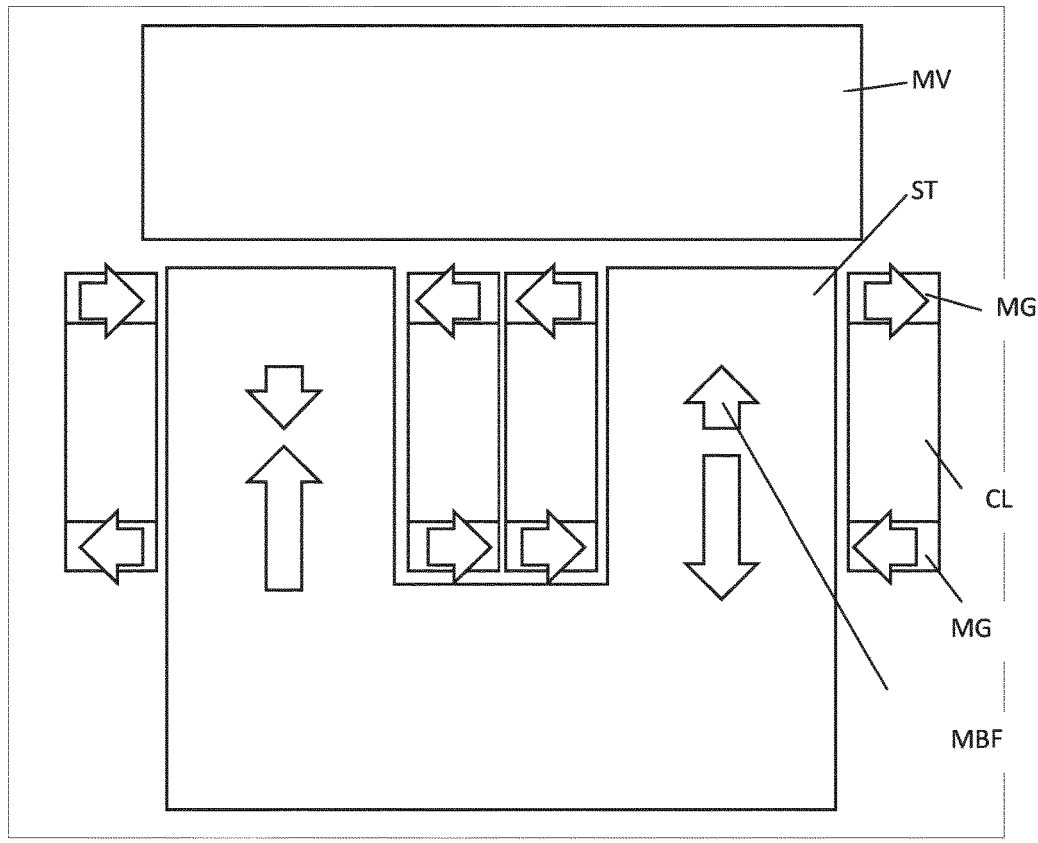

FIG. 11 depicts a schematic view of a reluctance actuator according to an embodiment of the invention.

FIGS. 12A and 12B respectively depict magnetic flux and force versus time to illustrate a calibration method according to an aspect of the invention.

FIG. 13 depicts magnetic flux versus force to illustrate a calibration method according to an aspect of the invention.

Figure 14:
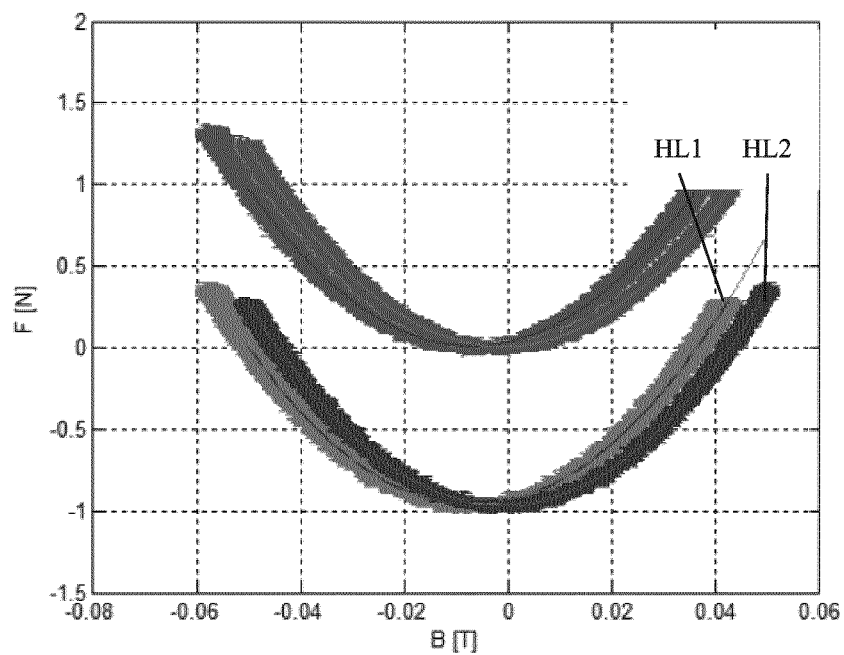

FIG. 14 depicts magnetic flux versus force with and without a disturbance force to illustrate a calibration method according to an aspect of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
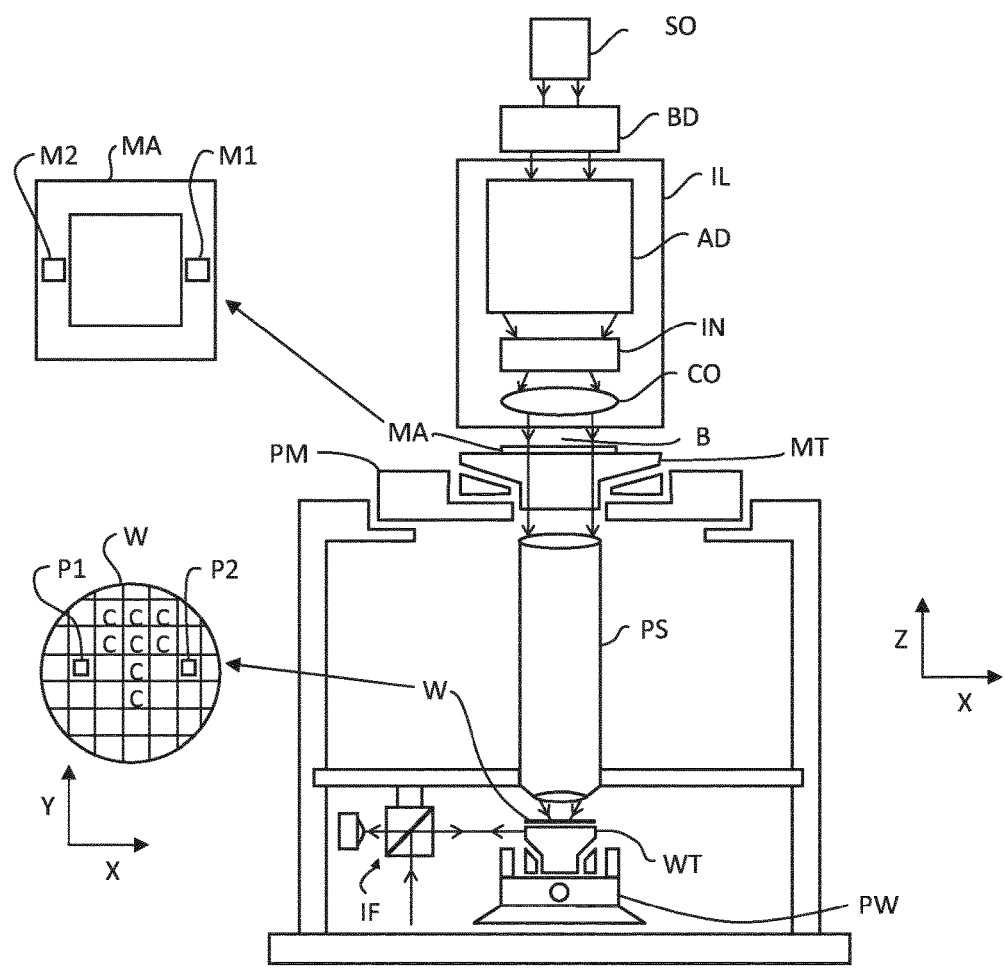
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

US-2011-0069293-A1, which is incorporated herein in its entirety by reference, discloses a reluctance actuator that may provide a configuration in two degrees of freedom. US-2012-0019794-A1, which is incorporated herein in its entirety by reference, discloses a principle of flux measurement, as may be applied in reluctance actuators.

A reluctance actuator in general exhibits a non-linear relation between an actuator current, an actuator force and an actuator gap. Application of a flux sensor to measure a flux in the actuator gap has been described previously. A first aspect of the invention aims at a calibration of such a flux sensor.

The actuator force and the magnetic flux in the actuator gap exhibit a quadratic relation, as expressed by:

$$F = kB^2,$$

where k [N/T$^2$] is an actuator constant and B [T] is a magnetic flux density in the actuator gap. This magnetic flux density is measured by a flux sensor such as in this example a Hall sensor. An error on this measurement may result in a force error, i.e., $$\hat{F} = k(B + B_e)^2$$
$$= \underbrace{kB^2}_{F} + \underbrace{2kBB_e + kB_e^2}_{F_e},$$

where $B_e$ [T] is a flux density measurement error, $\hat{F}$ [N] is a force estimate, F [N] is a real actuator force and $F_e$ [N] is the force error.

Due to the quadratic relation between flux and force, the force error may scale with flux. The Hall sensor acts as a transducer from magnetic flux density to voltage. To be able to perform sensor offset calibration, it may be desirable to distinguish between voltage offset induced by read-out electronics and voltage offset introduced by small magnetic flux density fields. Additionally, it may be desirable to determine the actuator constant k that relates magnetic flux density to force.

A proposed solution is to inject a flux setpoint to the actuator that has a DC term and a sinusoidal term, i.e.

$$B = B_0 + B_1 \sin(\bar{\omega}t).$$

The actuator force now equals $$F_a = k(B_0 + B_1 \sin(\varpi t))^2$$
$$= k\left(B_0^2 + \frac{B_1^2}{2}\right) + 2kB_0 B_1 \sin(\varpi t) - \frac{kB_1^2}{2}\cos(2\varpi t).$$

This implies a DC force, a force at radial frequency w and a force at twice the radial frequency w, the second harmonic due to the quadratic relation between flux density and force.

Introducing the offset error Be into the equation, the resulting applied force equals $$B = B_0 + B_1 \sin(\varpi t) + B_e,$$
$$F_a = k(B_0 + B_1 \sin(\varpi t) + B_e)^2$$
$$= k\left([B_0 + B_e]^2 + \frac{B_1^2}{2}\right) + 2k[B_0 + B_e]B_1 \sin(\varpi t) - \frac{kB_1^2}{2}\cos(2\varpi t).$$

The actual time-varying actuator force may be derived from the measured displacement of the encoder block. Due to the applied force, the actuator (or the stage or other structure to which the actuator is connected) starts shaking at frequencies w and 2w. The force at both radial frequencies may be accurately determined by measuring for example for multiple period times of the radial frequency. A Fourier transform may be applied to determine the realized forces at frequencies w and 2w. Hence, the measured force may be written as $$F_m = F_0 + F_1 \sin(\bar{\omega}t) - F_2 \cos(2\bar{\omega}t).$$

Next, the gain and the offset of the sensor can be solved from the combined equations, i.e., $$F_1 = 2k[B_0 + B_e]B_1$$
$$F_2 = \frac{kB_1^2}{2}$$

solving for k and $B_e$ results in $$k = \frac{2F_2}{B_1^2}$$
$$B_e = \frac{B_1}{4F_2}F_1 - B_0.$$

Hence, the described calibration method allows a calibration of the actuator gain k as well as of the offset, allowing a relatively fast calibration. Furthermore, as in the above expression the actuator constant k does not depend on the sensor offset, the actuator constant k may be determined independently from the sensor offset. In other words, a sensor offset may have no effect on the actuator gain calibration.

FIG. 2 schematically depicts a reluctance actuator comprising two stators ST each having two teeth, each being provided with a respective coil CL. The reluctance actuator further comprises a mover MV and a flux sensor FS (such as a Hall sensor) in an actuator gap between one of the teeth of the stator ST and the mover MV. A flux amplifier FA is provided to drive a respective one of the coils CL. The flux amplifier FA is provided with a setpoint input at which a flux setpoint FST (i.e. a desired flux) may be applied, and with a flux feedback input FF connected to the flux sensor FS so that a signal from the flux sensor FS is provided for feedback. Application of the above calibration method to the configuration depicted in FIG. 2 provides for a magnetic flux B having a constant term and a sinusoidally time varying term, as depicted in FIG. 3A, where the magnetic flux B is depicted at the vertical axis against time at the horizontal axis. The force generated by the actuator may be measured by for example a Lorentz actuator and is depicted in FIG. 3B, depicting the measured actuator force at the vertical axis versus time at the horizontal axis. As described above, deriving from the measured force a frequency component at the frequency of the applied sinusoidally changing flux component, and a frequency component at twice this frequency (i.e. at the second harmonic thereof), allows to determine the actuator constant and the offset.

The above described calibration may be applied with a reluctance actuator as described with reference to FIG. 2. This calibration may however also be applied to any other reluctance actuator having a flux sensing, such as the actuators described below with reference to FIGS. 5-11.

A calibration of the reluctance actuator according to another aspect of the invention will be described below.

Suppose the actuator exhibits a hysteresis that may lead to a force of 1 [mN] at zero current. In case this hysteresis would be neglected and the Hall sensor offset would be calibrated to indicate zero flux in this operation point, a force error at 1 [kN] force would equal 2 [N] (assuming $k_1$=4e2 N/T$^2$). Therefore, accurate sensor offset calibration may be desirable that incorporates actuator hysteresis effects.

It is noted that a direct measurement of such hysteresis force may be inaccurate, since mN force level may be very difficult to measure in for example a wafer stage application due to a force disturbance from other sources such as cables and other actuators.

The Hall sensor acts as a transducer from magnetic flux density to voltage. To be able to do sensor offset calibration, a distinguishing between voltage offset induced by read-out electronics and voltage offset introduced by small magnetic flux density fields may be desirable.

To make such distinction, reverting to the configuration depicted in FIG. 2, the Hall sensor (flux sensor FS) is measured while the actuator gap is varied and the flux amplifier FA of the actuator is disabled (i.e., zero current). The hysteresis flux varies due to gap variation and therefore the Hall sensor voltage output may vary. The Hall sensor voltage offset due to electronics may not vary as a function of actuator gap. This measurement allows to determine both the hysteresis flux and the sensor voltage offset.

To demonstrate the principle, a measurement of Hall sensor voltage as a function of magnetic gap is shown in FIG. 4, which depicts flux density B versus actuator gap GP. As depicted in FIG. 4, the output voltage due the hysteresis flux is proportional to 1/g, where g is the magnetic actuator gap.

From FIG. 4, it is shown that one may distinguish between hysteresis effects and electronics offset voltage. The measured flux density can be written as $$\hat{B} = \frac{c}{g} + o,$$

wherein c is a constant term resulting from actuator hysteresis, o is a constant term resulting from electronics offset and g is the magnetic actuator gap. The offset may thus be determined from an asymptote of the curve. In this example, the fitted parameters are c=1.3 [mT·m] and o=1.4 [mT].

Due to the improvement of Hall sensor accuracy, it may further be possible to remove the flux measurement coil from the actuator. This may result in reduced costs, reduced complexity and improved manufacturability of the actuator.

The above described calibration may be applied with a reluctance actuator as described with reference to FIG. 2. This calibration may however also be applied to any other reluctance actuator having a flux sensing, such as the actuators described below with reference to FIGS. 5-11.

A calibration of the reluctance actuator according to yet another aspect of the invention will be described below. Suppose the sensor measures the magnetic-flux density in the actuator gap with a certain offset, i.e., $B_m = B + \beta$ wherein $B_m$ [T] is the measured flux-density field, B [T] is the real flux-density field and β [T] is the sensor offset. In a next step of the calibration a sinusoidal magnetic flux-density setpoint centered around zero is provided to the reluctance actuator. Such a setpoint will result in a force $F = kB^2$ Which can be rewritten as $F = k(B_m - \beta)^2$ wherein k is the actuator constant [N/T$^2$]. It can be observed that the $B_m$–F relation is a parabolic curve that is shifted by the sensor offset β in the $B_m$-direction. This shift can be determined by fitting the measured parabolic curve.

To demonstrate this principle the described calibration procedure is verified in an experiment wherein a Lorentz actuator is used to counteract the force of the reluctance actuator. The magnetic flux-density and associated force signals are measured as a function of time (as shown in FIG. 12A and FIG. 12B, respectively). The resulting $B_m$–F curve (i.e. the force–flux density relation) is shown in FIG. 13 as well as the fitted parabolic curves for Hall Sensor 1 HL1 and Hall sensor 2 HL2, respectively. From the fitted curves, the Hall sensor offsets can be determined as $\beta_1$=−6.6838 [mT] and $\beta_2$=−0.78141 [mT], wherein the subscript 1, 2 denote the offset of Hall sensor 1 and 2, respectively.

To further indicate that this method is substantially insensitive for static external forces resulting from e.g., cables or other actuators an external disturbance force of about 1 [N] has been applied between the stator and the mover of the reluctance actuator. The resulting parabolic curves, after repeating the calibration procedure, are shown in FIG. 14, wherein the resulting lower two curves are without the disturbance force and the resulting upper two curves are with the disturbance force. It can be observed that the sensor offset produces within 0.02 [mT]

A further aspect of the invention provides a reluctance actuator. The known reluctance actuator, as schematically depicted in FIG. 2, is a 1 degree of freedom (dof) actuator.

When applying such a reluctance actuator for moving a stage (e.g. a substrate table WT, e.g. a short stroke actuator of the substrate table WT), parasitic forces and torques in a non-principal direction may have to be counteracted by other actuators located at other positions on the stage. This may result in forces through the stage which lead to deformation, possibly resulting in overlay errors. As a result of this, crosstalk specification of the actuator may be very strict.

For a highest possible performance, the mover of the actuator may have a low mass and a high stiffness. A geometry of the actuator as schematically depicted in FIG. 2 may be not optimal in this respect.

An aspect of the invention provides a multi-dof flux controlled reluctance actuator. An embodiment of such reluctance actuator is schematically depicted in FIG. 5A-5C. The reluctance actuator comprises a stator ST comprising a stator yoke SY forming a closed magnetic path around a center space (seen in a plane of movement of the actuator), a plurality of teeth TH each projecting from the stator yoke SY into the center space, and a plurality of coils CL each being arranged for generating a magnetic flux in respective ones of the teeth TH; and a mover MV comprising a plurality of faces, each of the faces facing a respective one of the teeth TH to form a gap between the mover MV and the respective one of the teeth. The mover is arranged in the center space. In the configuration depicted in FIG. 5A, 4 teeth are provided. Each of the teeth is provided with its respective coil. The yoke provides a magnetically conducting path that connects all teeth. The mover is provided with 4 sides, i.e. 4 faces which each face a respective one of the teeth. When actuating a coil (i.e. providing an electrical current in the coil) a magnetic flux will be generated in the corresponding one of the teeth resulting in a corresponding force between the mover and the one of the teeth. To form closed magnetic flux lines, the magnetic flux will flow back to the yoke via one or more of the other teeth. In order to direct an actuator force as desired, the other coils may be actuated correspondingly. As the teeth and corresponding coils are arranged substantially symmetrically, actuating the coil of the one of the teeth, and correspondingly actuating both its neighboring (symmetrical) coils, will result in a force on the mover towards the one of the teeth. An example is depicted in FIG. 5B, whereby the one of the Y coils is actuated causing a flux in the corresponding one of the teeth. The coils of both neighboring teeth, i.e. the coils of the left and right one of the teeth in X direction are operated as well and both generating a correspondingly lower magnetic flux in the respective teeth. As both neighboring teeth are arranged symmetrical in respect of the mover and as their coils result in a flux having substantially a same magnitude, the X teeth provide for opposing forces on the mover, effectively cancelling each other, thus resulting in a net force on the mover in Y direction towards the (actuated) one of the teeth. Another example is depicted in FIG. 5C. Here, one X coil and one Y coil is powered at substantially a same flux, resulting in forces on the mover towards both these two neighboring teeth. As a result, a net force onto the mover is generated at under an angle of 45 degrees in respect of the X and Y axis.

The reluctance actuator according to an aspect of the invention may further comprise a flux sensor per tooth, the flux sensor being provided in the gap between the mover and the tooth. Flux control may be provided in that the reluctance actuator further comprises a flux amplifier to drive the coils of the reluctance actuator based on a flux set point and the flux measured by the flux sensors, as described above with reference to FIG. 2. The flux amplifier may be formed by a multi channel amplifier to drive the various coils of the actuator. Likewise, the flux setpoint may comprise a setpoint per tooth. Flux density measurement on all teeth may be used to control flux paths in such a way that the resulting force vector has a desired direction and magnitude. Generally, at each tooth of the stator an attractive force is generated to the mover. A desired force vector may hence be translated into 4 components (one for each tooth). From each of these components a flux set point may be derived according to previously described formula $F=k \cdot B^2$ (with F: force; k a constant for the actuator and B the flux density). The voltage to each coil may be controlled such that measured flux matches the flux set point. In this way, the force on each tooth can be controlled and an arbitrary 2D force vector can be made.

It is noted that the (linear) actuator can make simultaneous maximum force in x and y giving a maximum total force under 45 degree of sqrt(2) times the max force in X and Y. This can be done without introducing forces into the stage.

FIGS. 6A-6C depict alternative geometries of the actuator described with reference to FIG. 5A-5C. The alternative geometries may provide similar results. Generally, such alternatives may exhibit a smaller total volume and/or mass, as the yoke may be kept more compact. This may be the case as the teeth may be kept smaller (since they do not have to accommodate the coils, causing the yoke to be smaller hence allowing a lower weight thereof. In the embodiments depicted in FIG. 6A-6C, the coils are provided around respective parts of the yoke between neighboring teeth. The configuration depicted in FIG. 6B may generate a relatively larger force in the X and Y directions, as the fluxes in and force components by 2 teeth contribute to the net force in X respectively Y direction.

A maximum force that can be delivered by a reluctance actuator is typically limited by saturation of either mover or stator. The maximum force that can be delivered by a 1 dof double C-core configuration, as schematically depicted in FIG. 2, is proportional to a surface area of the tooth thereof. A cross section of the C-core and mover should hence be similar to this cross section in order to avoid saturation at a different point in the actuator.

For the 2 dof actuator illustrated in FIG. 5A-C, the maximum force is likewise proportional to the surface area on the teeth. Since, in the configuration depicted in FIG. 5A-5C, when generating a force in X or Y direction, there is only one tooth that generates this maximum force, the max force is approximately half that of a double C-core actuator having a similar tooth size. However, the flux path is divided into a left and right path through the stator. In these parts, the stator cross section can be reduced, saving mass on the stator of the actuator. When using two 2 dof actuators in a rotated (45 degree) setup, a factor of sqrt(2) additional force can be obtained in principal direction compared to two 1 dof actuators, which 1 dof actuators may not be used in this way due to the large internal stage force that it would generate. Thus, compared to the 1 dof reluctance actuator configuration as described with reference to FIG. 2, a mass reduction and stiffness improvement may be obtained due to the removal of a non-contributing middle part.

The concept of the reluctance actuator according to the principles described with reference to FIGS. 5 and 6, may be further generalized to multiple dof's. For example in FIGS. 7A and 7B an actuator is illustrated that may be used for x, y and Rz actuation. In FIG. 8, a basic geometry for an actuator for x, y, z is shown. In general it is possible to make an actuator that works in 6 dof's.

In some cases it might be beneficial to have an actuator that can make a higher maximum force in one direction compared to other directions. This can be achieved by using an asymmetric geometry as illustrated in FIG. 9A, where the teeth in Y direction have a larger surface than the ones in X direction, allowing to generate a maximum force in Y direction which exceeds the maximum force in X direction. In FIG. 9B an actuator is illustrated with a triangular design. In principle such configuration may also be used to generate forces in 2 dof. However, this actuator may be less efficient because the diagonal placed sides may result in a force component in the wrong direction. From geometric relations it can be deducted that the resulting max force is half that of the actuator in FIG. 6a (assuming equal tooth area).

In the configurations as depicted in FIGS. 5A-C and 6A-C, 4 sides of the mover are used for force generation. The more sides of the mover are used for force generation, the less sides are available for mover attachment. However, attachment on either top or bottom surface of the mover may be sufficient for a stiff connection. An attachment on either top or bottom surface of the mover may provide as advantage a smaller size of the mover which may cause less problems by thermal deformation.

An example of a stage actuator layout is illustrated in FIGS. 10A and 10B. FIGS. 10A and 10B each depict a highly schematic top view of the stage, such as a substrate table WT. The stage is provided with 8 actuators, 2 along each side of the stage. The actuators ACT are arranged symmetrically in respect of center lines of the stage along the X-axis as well as along the Y-axis. In FIG. 10A, the 8 actuators are one dof actuators as described with reference to FIG. 2, namely 4 in X-direction (along the sides of the stage that extend in the X-direction) and 4 in Y-direction (along the sides of the stage that extend in the Y-direction). In FIG. 10B, 8 2 dof actuators are provided of a type as described with reference to FIGS. 5A-C and 6A-C. The actuators are arranged symmetrically in respect of center lines of the stage along the X-axis as well as along the Y-axis, 2 actuators along each side of the stage. The actuators are oriented such that the teeth of the actuators are directed at an angle of 45 degrees in respect of the X-axis and Y-axis, so as to maximize a force to be generated by the actuators in the X-direction and Y-directions. A simultaneous actuation by the large number of actuators, may provide high forces onto the stage so as to allow high accelerations, while reducing torques and possibly resulting excitation of bending modes, etc, in the stage.

Using the reluctance actuators as described with reference to FIGS. 5A-5C and 6A-6C, a number of effects may be achieved, as will be explained below. With two 2 dof actuators on a stage, both x, y and Rz may be controlled: which may not be achieved with two 1 dof actuators which have about the same weight and maximum force. At least 3 of such 1 dof actuators may be required. When replacing a number of 1 dof actuators by a similar number of 2 dof actuators, a significant reduction of the moving mass (as well as a stiffness improvement) may be obtained. Leaving other parameters like max force and required volume and total mass equal or better. Replacing eight 1 dof actuators (4 X and 4 Y) by similar sized 2 dof actuators may distribute the forces more evenly over the stage resulting in less deformation due to acceleration. In addition it may provide additional degrees of freedom which may be used for over actuation (and consequently suppressing internal dynamic modes of the stage) Each 2 dof actuator may provide a force vector in any (2D) direction, Alignment problems and parasitic forces in the actuator may be calibrated and taken out locally by each individual actuator. So there may be less or no need any more to cancel crosstalk from one actuator by another (which would result in stage deformation). By putting the actuators under 45 degree rotation, the maximum forces in principal direction can be increased by a factor of SQRT(2) since both the maximum X' and Y' force can contribute to the total force.

Generally, with all types of reluctance actuators, in order to prevent saturation in reluctance actuators, the cross section areas of the magnetically permeable structures should be large enough to prevent magnetic saturation. In order to minimize mass the designer needs to balance between saturation on the one hand and actuator mass on the other hand. According to an aspect of the invention, in order to limit saturation small permanent magnets may be placed around the coil, such that they provide a bias flux opposing the flux generated by the coil. An example being shown in FIG. 11. A flux from the coils is directed in the same direction. The flux created by the permanent magnets is reducing the net flux in the core, such that saturation occurs at higher current levels.

The reluctance actuator as depicted in FIG. 11 comprises a stator comprising a stator yoke ST, a plurality of teeth each projecting from the stator yoke, and a plurality of coils CL each being arranged for generating a magnetic flux in respective ones of the teeth, wherein pairs of permanent magnets MG are provided to generate a magnetic bias flux MBF having a direction opposite to a flux generated in operation by the respective coil. The pairs of permanent magnets are arranged such that the magnetic bias flux does have no or no substantial effect on the magnetic flux in the gap. It is noted that the permanent magnets to generate a magnetic flux having a direction opposite to the flux generated in operation by the respective coil, may be applied with any reluctance actuator, including the ones described with reference to FIG. 2-10.

The flux sensors as applied in the reluctance actuators as described throughout this document, may be formed by a Hall sensor, a combination of a Hall sensor and a coil, or any other type of flux sensor or sensor combination.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents

What is claimed is:

1. A linear reluctance actuator comprising:
a stator comprising:
a stator yoke forming a closed magnetic path around a center space,
a plurality of teeth in an X axis and Y axis of the linear reluctance actuator, each tooth of the plurality of teeth projecting from the stator yoke into the center space, and
a plurality of coils, each coil of the plurality of coils being configured to generate a magnetic flux in respective ones of the teeth; and
a mover arranged in the center space and displaceable relative to the stator yoke in the X axis and in the Y axis, the mover comprising a plurality of faces, each face of the plurality of faces facing a respective one of the teeth to form a gap between the mover and the respective one of the teeth, wherein each face of the plurality of faces has a surface facing a surface of the respective one of the plurality of teeth and the surfaces are substantially planar, wherein actuation of at least one coil results in a force in at least one of the X axis and Y axis of the linear reluctance actuator, thereby displacing the mover relative to the stator yoke in the at least one of the X and Y axis.

2. The linear reluctance actuator according to claim 1, further comprising a flux sensor per tooth, the flux sensor being provided in the gap between the mover and the tooth.

3. The linear reluctance actuator according to claim 2, further comprising a flux amplifier configured to drive the coils of the linear reluctance actuator based on a flux set point and the flux measured by the flux sensors.

4. The linear reluctance actuator according to claim 1, wherein each coil of the plurality of coils is positioned around a respective one of the teeth.

5. The linear reluctance actuator according to claim 1, wherein each coil of the plurality of coils is positioned around a respective part of the stator yoke between neighboring teeth.

6. The linear reluctance actuator according to claim 1, comprising four teeth and four coils.

7. A lithographic apparatus arranged to transfer a pattern from a patterning device onto a substrate, the lithographic apparatus comprising:
a movable object; and
a reluctance actuator configured to move the movable object, the reluctance actuator comprising:
a stator comprising:
a stator yoke forming a closed magnetic path around a center space,
a plurality of teeth in an X axis and Y axis of the reluctance actuator, each tooth of the plurality of teeth projecting from the stator yoke into the center space, and
a plurality of coils, each coil of the plurality of coils being configured to generate a magnetic flux in respective ones of the teeth; and
a mover arranged in the center space and displaceable relative to the stator yoke in the X axis and in the Y axis, the mover comprising a plurality of faces, each face of the plurality of faces facing a respective one of the teeth to form a gap between the mover and the respective one of the teeth, wherein actuation of at least one coil results in a force in at least one of the X axis and Y axis of the reluctance actuator, thereby displacing the mover relative to the stator yoke in the at least one of the X and Y axis.

8. The lithographic apparatus according to claim 7, wherein the reluctance actuator comprises at least four teeth and four coils.

9. The lithographic apparatus according to claim 8, wherein each of the four teeth of the reluctance actuator is oriented at an angle of substantially 45 degrees with respect to a scanning direction of the movable object.

10. The lithographic apparatus according to claim 7, wherein the reluctance actuator further comprises a flux sensor per tooth, the flux sensor being provided in the gap between the mover and the tooth.

11. The lithographic apparatus according to claim 7, wherein the reluctance actuator further comprises a flux amplifier configured to drive the coils of the reluctance actuator based on a flux set point and the flux measured by the flux sensors.

12. The lithographic apparatus according to claim 7, wherein each coil of the plurality of coils is positioned around a respective one of the teeth.

13. The lithographic apparatus according to claim 7, wherein each coil of the plurality of coils is positioned around a respective part of the stator yoke between neighboring teeth.

* * * * *